United States Patent

[11] 3,590,479

[72] Inventor Dale Byron Devries
Richardson, Tex.
[21] Appl. No. 810,412
[22] Filed Oct. 28, 1968
Division of Ser. No. 484,535, Sept. 2, 1965, Pat. No. 3,475,664.
[45] Patented July 6, 1971
[73] Assignee Texas Instruments Incorporated
Dallas, Tex.

[54] METHOD FOR MAKING AMBIENT ATMOSPHERE ISOLATED SEMICONDUCTOR DEVICES
5 Claims, 7 Drawing Figs.

[52] U.S. Cl. ........ 29/578, 29/580, 29/589, 29/591
[51] Int. Cl. ........ B01j 17/00, H01l 7/10, H01l 7/48, H01l 5/00, H01l 7/12, H01l 7/54
[50] Field of Search ........ 317/234, 235, 101; 148/1.5; 156/17; 29/569—591

[56] References Cited
UNITED STATES PATENTS

| | | | |
|---|---|---|---|
| 2,919,388 | 12/1959 | Ross | 29/576 |
| 3,199,002 | 8/1965 | Martin, Jr. | 29/589 |
| 3,212,162 | 10/1965 | Moore | 29/589 |
| 3,307,239 | 3/1967 | Lepselter et al. | 29/591 |
| 3,313,013 | 4/1967 | Last | 317/101 |
| 3,335,338 | 8/1967 | Lepselter | 317/101 |
| 3,396,312 | 8/1968 | Cunningham et al. | 317/101 |
| 3,432,919 | 3/1969 | Rosvold | 29/589 |
| 3,461,548 | 8/1969 | Schutze et al. | 29/590 |
| 3,475,664 | 10/1969 | De Vries | 29/578 |
| 3,479,736 | 11/1969 | Toki et al. | 29/589 |

OTHER REFERENCES

" Integrated Circuit Package," IBM TECHNICAL DISCLOSURE BULLETIN, Vol. 3, No. 12, May 1961, pages 26— 27, by R. S. Schwartz

*Primary Examiner*—John F. Campbell
*Assistant Examiner*—Richard Bernard Lazarus
*Attorneys*—Samuel M. Mims, Jr., James O. Dixon, Andrew M. Hassell, Harold Levine and John E. Vandigriff

ABSTRACT: Disclosed are methods for making integrated circuits which use the ambient fabrication atmosphere as an isolation medium between elements of the circuit, such methods advantageously produce devices having improved mechanical structure, improved surface area for attaching lead wires, reduced collector area, and lower stray capacitance.

INVENTOR
Dale DeVries

INVENTOR
Dale DeVries

METHOD FOR MAKING AMBIENT ATMOSPHERE ISOLATED SEMICONDUCTOR DEVICES

This is a division of application Ser. No. 484,535, filed Sept. 2, 1965.

This invention relates to semiconductor devices including integrated circuits and to methods of making same. More particularly, it relates to integrated circuit devices which use the ambient fabrication atmosphere as an isolation medium between elements of the circuit.

In a high frequency integrated circuit it is desirable to electrically isolate various elements of the circuit by some means which produces a lower capacitive coupling between them than that afforded by the conventional PN junction isolation. PN junction isolation is achieved by the use of the high resistance, reverse-bias characteristics of such a junction, said junction being physically located between the elements to be isolated. There are two common ways of building a PN junction isolation region, namely, that of using a diffused collector and that of using an epitaxial collector. Because the reverse biased PN junction can only be used up to a voltage which is determined by the impurity concentrations at the collector-isolation junction, both of these methods produce devices which are voltage limited. In order to make a transistor having a low collector saturation resistance (Rcs), it is necessary to have a high surface impurity concentration. This high impurity concentration causes the concomitant PN junction breakdown voltage to be low. Thus, the conventional PN junction isolation makes it quite difficult to fabricate a device having both high voltage breakdown and low Rcs characteristics.

A second disadvantage of PN junction isolation is the capacitive coupling which, existing between isolated islands and the substrate, seriously impairs the ability of the device to operate at the higher frequencies.

There is also a problem in controlling the PNPN action of the active PN junction, such as in a transistor or diode, coupled with the isolation PN junction. This problem can be lessened somewhat by introducing a second epitaxial layer which is, for example, highly N-doped for the case of P-type substrate. This solution is nonetheless plagued with the same problem of attempting to fabricate a low Rcs, high collector-base breakdown voltage device.

As integrated circuit technology advances, additional active and passive elements are being crowded into monolithic semiconductor networks, increasing the number of such elements thereon, and placing them into progressively smaller spaces. The necessary reduction in the size of the elements presents a serious problem when attempting to make internal connections between the elements and connections external thereto. A technique to make these connections has been previously developed for making a solid package wherein the bonding of jumper wires is rendered unnecessary by constructing a multilayer lead device with interconnections in thin layers and insulated from the other layers by an insulating material. In this manner, larger contact areas are provided for making external connections to the devices of the network.

Beam lead techniques using thick leads for mechanical support have also been developed which utilize air insulation between the components. However, such techniques do not lend themselves to the aforedescribed multilayer lead system because of the thickness of the leads.

It is therefore an object of the present invention to provide a method of fabricating an integrated circuit device which uses the ambient fabrication atmosphere (air, for example) as the insulation medium between the elements of the circuit and which has an improved mechanical structure.

It is yet another object of the invention to provide an integrated circuit device having an improved surface area for attaching lead wires thereto.

Transistors are conventionally fabricated in such a manner as to place the collector surface of the device in contact with a header portion. Thus the emitter and base regions, as in a planar diffused device, are exposed to view from the surface opposite that of the collector surface. However, this type of fabrication results in the relatively small emitter and base regions being embedded in a collector region which is relatively thick and of large area. Because the area of the collector is large, there is a large stray capacitance between the collector and the can (cap or lid) of the device, such capacitance being usually undesirable in high frequency applications. Such a fabrication also places a limitation upon how small a semiconductor device can be built, since the entire collector region is always larger than that portion of the collector which is used in the transistor action. Although these limitations have been described in relation to a transistor they are equally true in relation to other semiconductor devices, such as capacitors, diodes, field-effect transistors and the like.

It is therefore a further object of the invention to provide a semiconductor device and a method of making the same which has a reduced collector area and a lower stray capacitance.

Likewise, it is another object of the invention to provide an integrated circuit device having semiconductor devices therein which have active regions of reduced area and lower stray capacitance.

It is yet another object to provide a semiconductor device and method of making the same which has an improved surface area for attaching lead wires thereto.

Other objects and features of the invention will be more readily understood from the following detailed description when read in conjunction with the appended claims and attached drawings, in which:

The invention, in brief, comprises an integrated circuit device and a method of making the same which utilizes the ambient fabrication atmosphere as the insulation medium between the elements, or components, of the circuit, wherein the device is characterized by the components being mounted "upside-down" on the substrate. The invention also contemplates a single semiconductor device, a transistor for example, which is mounted with the emitter, base and possibly the collector regions adjacent to the substrate.

Each embodiment of the invention utilized one or more "islands" of high conductivity semiconductor material between the metallized contacts which are in intimate relationship with the active semiconductor regions of a given device and the metallic pads to which lead wires may be attached.

Figures 1, 2:
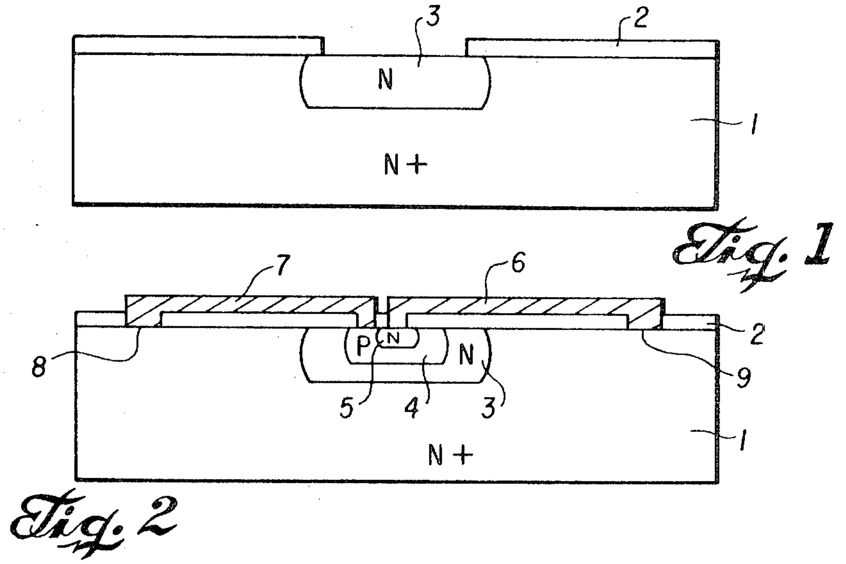
FIG. 1 illustrates a sectional view of a semiconductor wafer having a vapor-etched and redeposited semiconductor region therein.
FIG. 2 illustrates a sectional view of the wafer of FIG. 1 having diffused base and emitter regions in the redeposited region.

For a more detailed description, with specific reference to FIG. 1, there is shown a semiconductor wafer 1, for example highly doped N-type (commonly referred to as N+) silicon, having an oxide layer 2. By conventional selective masking and etching processes a portion of the layer 2 is removed and a region of the wafer 1 is then vapor etched to leave a cavity, not illustrated. Subsequent to the vapor etching step the cavity is filled with a less highly doped N-type silicon material 3 by a conventional redeposition process.

FIG. 2 illustrates how a transistor is formed in the collector region 3, having a conventional diffused base region 4 and a conventional emitter region 5, both of the diffused regions being the result of conventional photomasking and diffusion processes well known in the semiconductor industry. Metallized contacts 6 and 7 are then applied by conventional evaporation processes to the emitter region 5 and the base region 4, respectively. The contact region 7 also extends through the oxide layer 2 to form a contact 8 with the N+ region 1, while the contact region 6 extends through the oxide layer 2 to form a contact 9 with the N+ region 1.

Figures 6, 7:
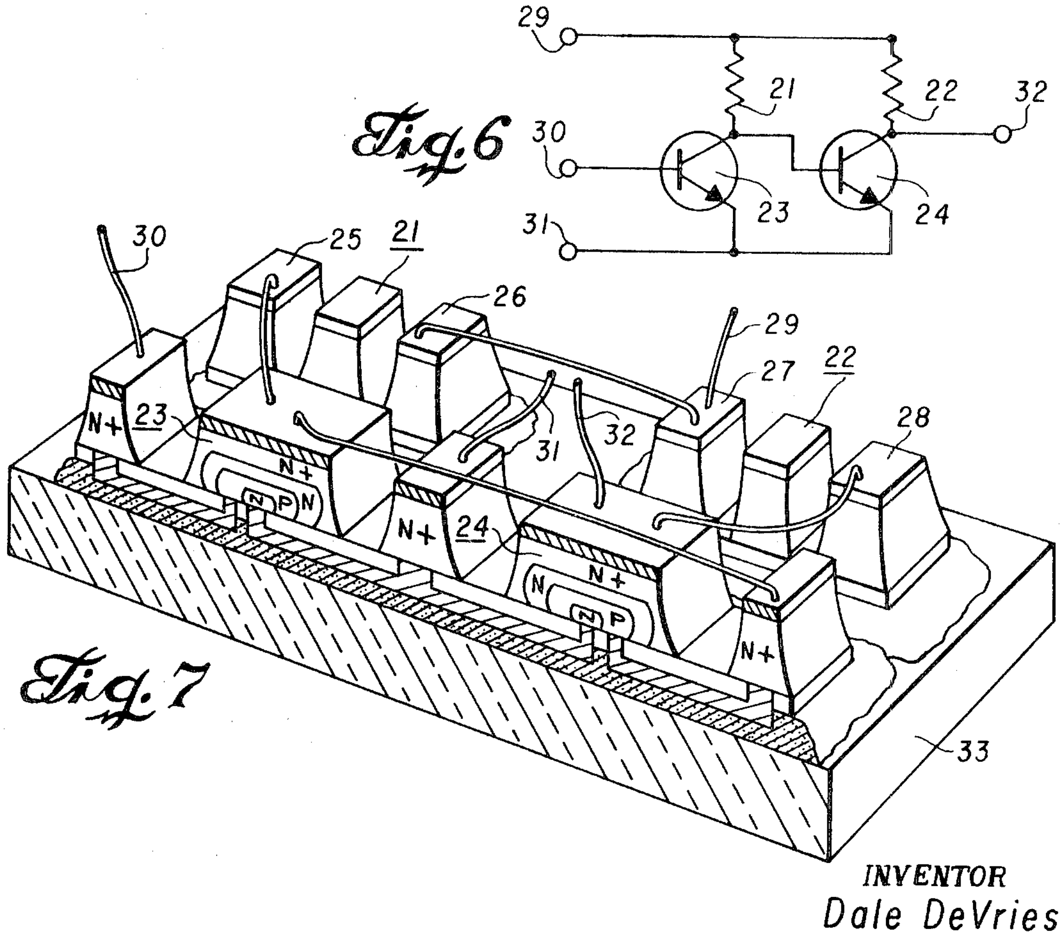
FIG. 6 illustrates a schematic representation of a simple circuit easily adaptable to integrated circuit fabrication processes according to the invention.
FIG. 7 illustrates a pictorial view of an integrated circuit fabricated according to the invention embodying the circuit of FIG. 6.

It will be appreciated that while the device of FIG. 2 has been illustrated as comprising one transistor diffused into a semiconductor wafer, this has been done for the sake of simplicity in pointing out the salient features of the invention as further illustrated in FIGS. 6 and 7. While the preferred embodiment comprises a semiconductor wafer of silicon, into which a silicon NPN transistor is diffused, it is obvious that the wafer and transistor are merely illustrative and are in so sense meant to be construed as a limitation upon the invention. Thus the wafer could be N or P-type silicon, germanium or any other available semiconductor material and the transistors could be any number (not limited to one) and any combination of NPN and PNP devices all interconnected as a circuit. There could also be resistors (as shown in FIG. 6 and 7) and capacitors (not shown) in the circuit, all or any of which are to be construed as being within the scope of the invention as defined herein.

Figure 3:
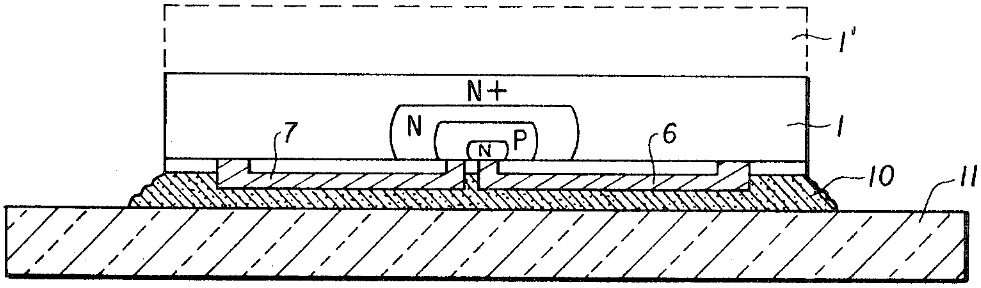
FIG. 3 illustrates a sectional view of the device of FIG. 2 mounted upon an insulating substrate according to the invention and inverted.

With reference to FIG. 3, the device of FIG. 2 is inverted and mounted to a ceramic substrate 11, utilizing an insulating adhesive material 10 such as cement, glass or epoxy, to cause one surface of the device to adhere to the substrate. Alternatively, the insulating material 11 could be deposited onto the silicon wafer, such as by deposition of a thick layer of quartz. The opposite, or top, surface 1 is then lapped or etched away down to a thickness of perhaps 1 mil, removing part 1' of the N+ material to simplify the subsequent selective etching. Gold or gold over molybdenum is then evaporated onto the top surface and selectively removed except over what will later be mesa tops, leaving gold contacts 15, 16 and 17. The opposite surface is then selectively masked by photoresist methods against the subsequent etching operation. Of course, the masking process step could be performed prior to mounting the device upon the substrate. A selective etchant, such as Cp8 by way of example, described in "Transistor Technology," Vol. 2, edited by F. J. Biondi, at page 598, is applied to the masked surface to remove the semiconductor material 1 between the "islands" 12, 13 and 14, as illustrated in FIG. 4.

Figure 4:
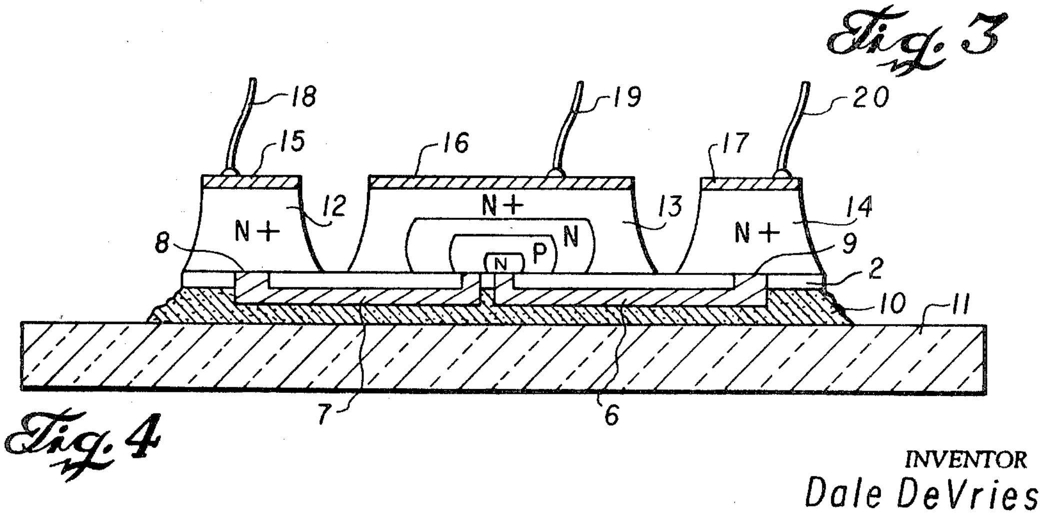
FIG. 4 illustrates a sectional view of the mounted device of FIG. 3 having etched out regions therein according to the invention.
Figure 5:
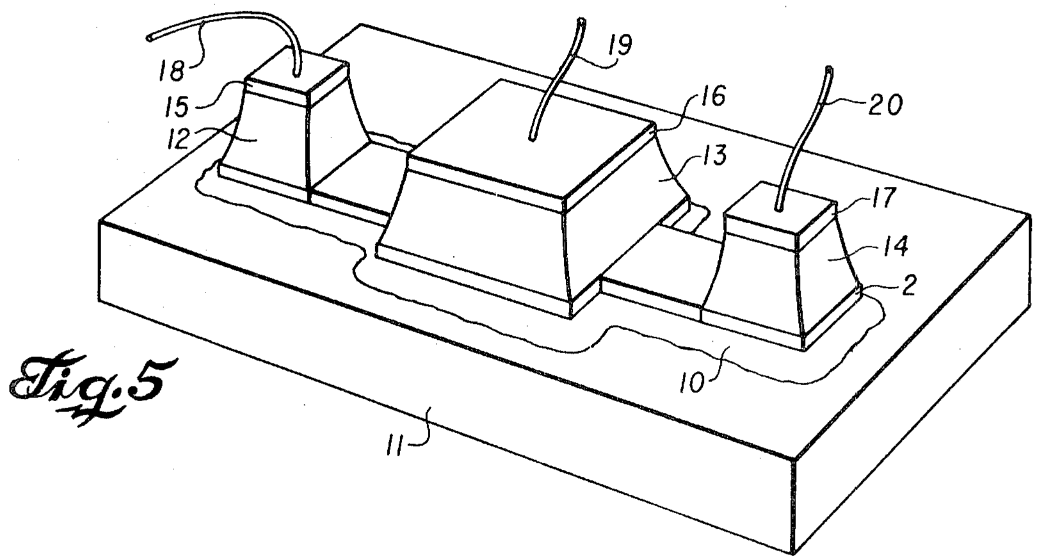
FIG. 5 illustrates a pictorial view of the device of FIG. 4.

As shown in FIGS. 4 and 5, the "islands" of the silicon wafer 1 which were not removed by the etch are now mesa-shaped, with metallized contacts 15, 16 and 17 on top. External leads 18, 19 and 20 are then respectively attached to these contacts, as by ball bonding, thereby to produce a device having a transistor with all necessary leans, a strong mechanical structure, air isolation between elements of the transistor, and a reduced collector area with its resulting lower stray capacitance.

As illustrated in FIG. 7, a simple circuit, such as shown in FIG. 6, comprising two transistors 23 and 24 and two resistors 21 and 22, is produced in a semiconductor wafer in a similar manner as described for the one transistor shown in FIG. 4, except that the resistors 21 and 22 normally require only one diffusion step and have no rectifying junctions. Of course, a different conductivity type than that of the resistors could be diffused around each or both of them, as is done in the conventional PN junction isolation resistor diffusion processes. But such is not necessary in the present embodiment of the invention. FIG. 6 schematically shows such a circuit, admittedly simple, made so in order to illustrate an operative circuit which utilizes the invention. FIG. 7 shows the resistors 21 and 22, with their respective metallized contacts. It likewise illustrates the transistors 23 and 24, along with the interconnections necessary to complete the circuit of FIG. 6. It should be appreciated that, as with a single transistor, the transistors of this circuit have a reduced collector region and a lesser capacitance. All of the external leads 29, 30, 31 and 32 make ohmic contact to the metallized contacts of the circuit elements, as do the interconnecting metallized regions, all of which may be done by any conventional technique, such as by ball bonding. Substrate 33, of some material such as is described in reference to the substrate 11 of FIG. 4, can then be mounted on a suitable header (not shown) to result in a packaged device.

While the circuit device of FIG. 7 has been illustrated as embodying the invention, such a circuit (as in FIG. 6) forms no part of the invention and is in no sense to be construed as a limiting factor, but is merely shown and described to illustrate one of a large number of circuits which could be embodied in an integrated circuit device fabricated according to the invention. Although the invention has been described in a simplified form with respect to a small wafer that involves only the isolation of a few elements, it will be appreciated that the invention is equally applicable to more complicated configurations wherein a larger multiplicity of elements are to be isolated within a single unit.

What I claim is:

1. A method of fabricating an integrated circuit device using the ambient atmosphere as an isolation medium comprising:

a. forming a plurality of semiconductor regions of one conductivity type in one surface of a semiconductor wafer of said one conductivity type, said wafer having a higher conductivity than said semiconductor regions and each of said semiconductor regions having at least one surface which is coplanar with said one surface of said wafer;

b. selectively forming semiconductor devices within said semiconductor regions adjacent said coplanar surfaces thereof;

c. selectively depositing metallized contact regions adjacent to said one surface of said wafer so as to selectively contact said semiconductor devices and said one surface of said wafer;

d. securing an insulating substrate to said one surface of said wafer overlying but insulated from said contact regions;

e. selectively masking regions of a second surface of said wafer;

f. selectively etching said wafer in the nonmasked regions of said second surface, thereby forming a plurality of mesa regions in said wafer electrically isolated from each other by the ambient atmosphere therebetween;

g. selectively depositing a metallized contact layer on the outer surface of each of said mesa regions remote from said substrate; and h. selectively attaching conductive leads to said contact layers of said mesa regions; whereby i. electrical paths are selectively provided between said contact layers of said mesa regions and said semiconductor devices.

2. The method of claim 1 and further including the step of selectively lapping said second surface of said wafer to lessen the thickness thereof prior to the selective masking of said second surface of said wafer.

3. The method of claim 1 wherein said step of forming a plurality of semiconductor regions in said wafer includes successive steps of vapor etching and semiconductor redeposition.

4. The method of claim 1 wherein said step of selectively forming semiconductor devices within said semiconductor regions includes the step of planar diffusion.

5. The method of claim 1 wherein said step of selectively forming semiconductor devices within said semiconductor regions includes the steps of forming a base region of opposite conductivity type within one of said semiconductor regions and forming an emitter region of said one conductivity type with said collector region and wherein said one semiconductor region is a collector region, thereby producing a transistor.